United States Patent
Feiweier et al.

(10) Patent No.: US 10,031,203 B2
(45) Date of Patent: Jul. 24, 2018

(54) METHOD AND APPARATUS FOR RECONSTRUCTING IMAGE DATA FROM UNDERSAMPLED RAW MAGNETIC RESONANCE DATA AND REFERENCE DATA

(71) Applicant: Siemens Healthcare GmbH, Erlangen (DE)

(72) Inventors: Thorsten Feiweier, Poxdorf (DE); Stephan Kannengiesser, Wuppertal (DE)

(73) Assignee: Siemens Healthcare GmbH, Erlangen (DE)

( * ) Notice: Subject to any disclaimer, the term of this patent is extended or adjusted under 35 U.S.C. 154(b) by 8 days.

(21) Appl. No.: 15/411,118

(22) Filed: Jan. 20, 2017

(65) Prior Publication Data

US 2017/0212196 A1    Jul. 27, 2017

(30) Foreign Application Priority Data

Jan. 22, 2016 (DE) .................. 10 2016 200 889

(51) Int. Cl.
*G01V 3/00* (2006.01)
*G01R 33/561* (2006.01)
(Continued)

(52) U.S. Cl.
CPC ....... *G01R 33/5616* (2013.01); *G01R 33/307* (2013.01); *G01R 33/385* (2013.01); *G01R 33/543* (2013.01)

(58) Field of Classification Search
CPC .............................................. G01R 33/5616
(Continued)

(56) References Cited

U.S. PATENT DOCUMENTS 5,138,259 A * 8/1992 Schmitt ............ G01R 33/56554
                                                        324/309
7,132,826 B1 * 11/2006 Jung .................. G01R 33/4824
                                                        324/307
(Continued)

FOREIGN PATENT DOCUMENTS

DE    10 2010 032 080 A1    1/2012

OTHER PUBLICATIONS

Chang, et al.: "A technique for accurate magnetic resonance imaging in the presence of field inhomogeneities", in: IEEE Trans. Med. Imaging, vol. 11, No. 3, pp. 319-329 (1992.
(Continued)

*Primary Examiner* — Louis Arana
(74) *Attorney, Agent, or Firm* — Schiff Hardin LLP

(57) ABSTRACT

In a method and magnetic resonance (MR) apparatus for reconstruction of image data of an examination object from undersampled raw MR data and reference data, undersampled raw data are used that were recorded from an examination region of the examination object by an MR control sequence, to which a reconstruction algorithm for the reconstruction of image data is assigned. A disturbance variable in the examination region is determined. A modulation function is established, which describes the influence of the disturbance variable on the MR control sequence. Modulated reference data are created on the basis of the modulation function and the reference data such that the modulated reference data are subjected to the influence of the disturbance variable on the raw data recorded by the MR control sequence. A combination algorithm is executed in order to reconstruct image data from the undersampled raw data with the use of the modulated reference data.

20 Claims, 6 Drawing Sheets

(51) Int. Cl.
*G01R 33/385* (2006.01)
*G01R 33/30* (2006.01)
*G01R 33/54* (2006.01)

(58) Field of Classification Search
USPC .......................................... 324/309, 307, 314
See application file for complete search history.

(56) References Cited

U.S. PATENT DOCUMENTS

| | | | |
|---|---|---|---|
| 9,417,305 B2* | 8/2016 | Zhai | G01R 33/5608 |
| 2012/0019246 A1 | 1/2012 | Kannengiesser et al. | |
| 2014/0009156 A1 | 1/2014 | Doneva et al. | |
| 2014/0126796 A1 | 5/2014 | Chesneau et al. | |
| 2015/0035530 A1* | 2/2015 | Tisdall | A61B 5/7285 324/307 |
| 2015/0130461 A1 | 5/2015 | Lee et al. | |

OTHER PUBLICATIONS

Polimeni, et. al.: "Reducing Sensitivity Losses Due to Respiration and Motion in Accelerated Echo Planar Imaging by Reordering the Autocalibration Data Acquisition",: Magnetic Resonance in Medicine (2016), vol. 75, pp. 665-679 (2016).

Blaimer,. et. al.: "Comparison of Phase-Constrained Parallel MRI Approaches: Analogies and Differences", Magnetic Resonance in Medicine, pp. 1-14, (2015,).

Xiang, et al.: "Correction for Geometric Distortion and N/2 Ghosting in EPI by Phase Labeling for Additional Coordinate Encoding (PLACE)"; Magnetic Resonance in Medicine, vol. 57, pp. 731-741(2007).

Willig-Onwuachi, et. al.: "Phase-Constrained Parallel MR Image Reconstruction: Using Symmetry to Increase Acceleration and Improve Image Quality", Proc. Intl. Soc. Mag. Reson. Med., vol. 11, p. 19 (2013).

Van Gorp et a.: "Geometrically undistorted MRI in the presence of field inhomogeneities using compressed sensing accelerated broadband 3D phase encoded turbo spin-echo imaging";Physics in Medicine and Biology, vol. 60; pp. 615-631; (2015).

* cited by examiner

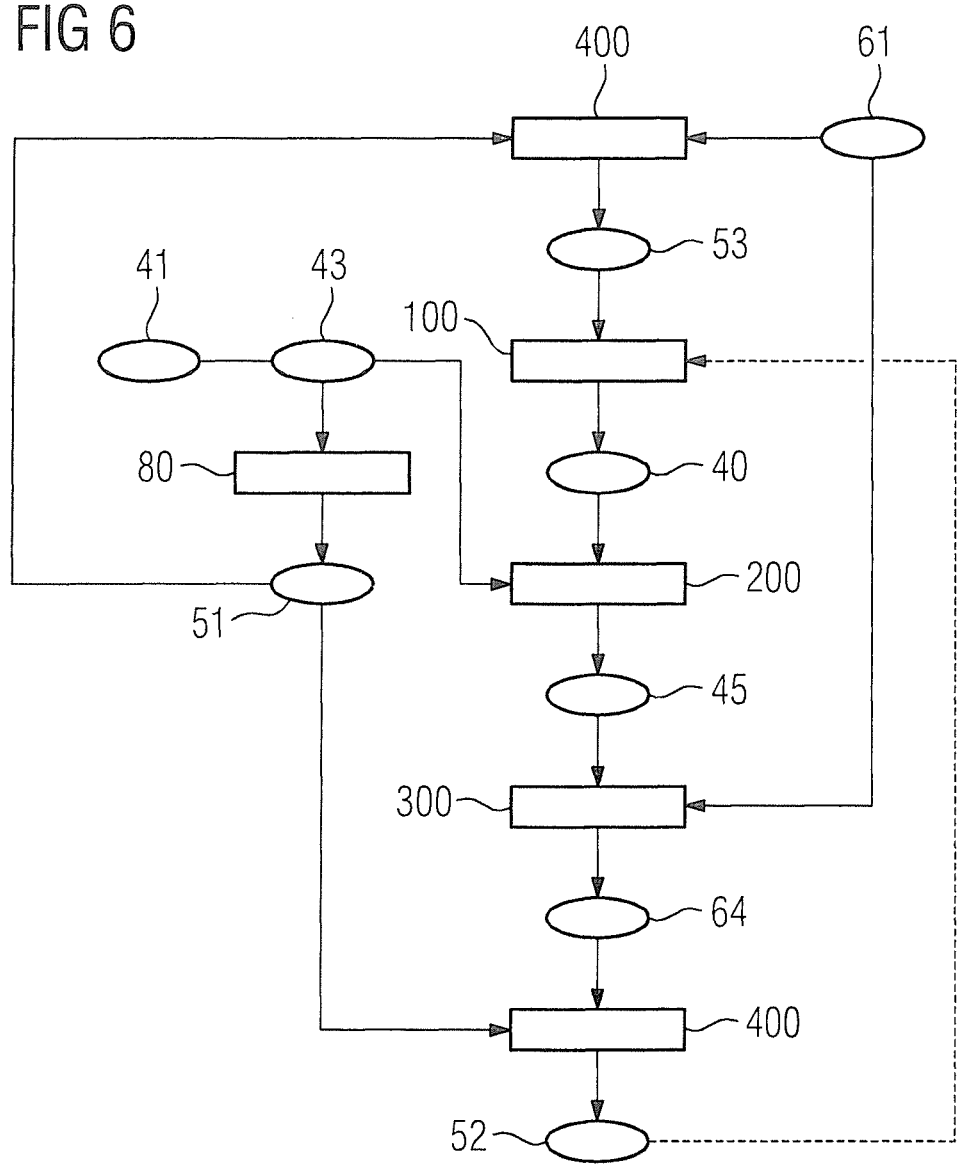

METHOD AND APPARATUS FOR RECONSTRUCTING IMAGE DATA FROM UNDERSAMPLED RAW MAGNETIC RESONANCE DATA AND REFERENCE DATA

BACKGROUND OF THE INVENTION

Field of the Invention

The invention relates to a method, a magnetic resonance apparatus, and a non-transitory, computer-readable data storage medium for reconstruction of image data from undersampled raw data and reference data.

Description of the Prior Art

In a magnetic resonance apparatus the object to be examined, for example a patient, is usually subjected by a basic field magnet to a relatively strong basic magnetic field, of 1.5 or 3 Tesla for example. In addition, a magnetic field gradient is applied by a gradient coil arrangement. Then, via a radio-frequency antenna, radio-frequency excitation signals (RF signals) are radiated by means of suitable antenna coils, which leads to the nuclear spins of specific atoms resonantly excited by this radio-frequency field being flipped by a defined flip angle in relation to the magnetic field lines of the basic magnetic field. In the resulting precession of the nuclear spin radio-frequency signals, so-called magnetic resonance signals (MR signals), are emitted, which are received by suitable reception antennas and then further processed. The data space in which the MR signals are present is referred to as k-space. The MR signals are digitized and stored in a k-space memory as a matrix of complex numerical values. The collection of complex numerical values of the k-space matrix is referred to as raw data. Associated image data are reconstructed from the raw data by execution of a multi-dimensional Fourier transformation, for example.

Since the image data can be reconstructed from the raw data by a Fourier transformation, the reconstruction is subject to the Nyquist criterion. The k-space data are transformed by the Fourier transformation into the image space. The k-space matrix is designed such that, when it is completely occupied by raw data (i.e. every available data entry point has been filled), the image data can be obtained from the raw data by an (if necessary) multi-dimensional Fourier transformation. The Nyquist criterion is then typically fulfilled. Consequently, if the k-space matrix is not completely occupied by raw data, then a Fourier transformation of the raw data results in erroneous image data.

For a particular measurement, a specific MR control sequence, also called a pulse sequence, is to be activated by the MR data acquisition scanner, which is composed of a sequence of radio-frequency pulses, in particular excitation pulses and refocusing pulses, as well as gradient pulses, suitably coordinated thereto. The gradient pulses create dynamic magnetic field gradients in different spatial directions, which are used for spatially encoding the raw data. The spatial encoding is typically done by a combination of different encoding methods. Phase encoding and frequency encoding are known examples of such encoding methods. Readout windows, which specify the periods of time in which the induced MR signals are acquired, must be set to match the encoding in time. In such cases the imaging is definitively determined by the timing within the sequence, i.e. the intervals in time at which pulses follow one another.

The application of an MR control sequence is typically more time-intensive as more raw data is recorded. A larger k-space matrix can be used, for example, for an increase in the resolution of the image data. In classical MR imaging, which employs a pure Fourier transformation for reconstruction of (preferably) error-free image data, a larger k-space matrix means a larger quantity of raw data, and thus an increase in the duration of the MR control sequence.

Parallel imaging is a widely-used method for shortening the measurement time and/or improving the resolution in MR imaging. The method is based on an undersampling of k-space, so that not all entries of the k-space matrix are occupied by raw data. The missing raw data for completing the k-space matrix can be provided, for example, as a result of symmetries or as a result of the knowledge of spatial sensitivity profiles of the receive antennas. Symmetries are utilized in the "Virtual Conjugate Coils" method (e.g. Blaimer et al., "Comparison of phase-constrained parallel MRI approaches: Analogies and differences", doi 10.1002/mrm.25685, MRM) or in "Partial Fourier" reconstruction methods, such as "Phase Constrained" parallel imaging (e.g. Willig-Onwuachi et al., "Phase-Constrained Parallel MR Image Reconstruction: Using Symmetry to Increase Acceleration and Improve Image Quality", Proc. ISMRM 2003, P. 19). Spatial sensitivity profiles of the receive antennas are used by SENSE or GRAPPA to speed up the recording, increase the resolution and/or reduce distortions.

Both image-based (e.g. SENSE) and k-space-based (e.g. GRAPPA) algorithms for parallel imaging require the recording of reference data, which allow deductions to be made about the sensitivity profile and/or the symmetry of the k-space data. In image-based methods, representative coil sensitivity profiles are recorded directly, and in k-space-based methods a representative section of k-space is completely sampled. The reference data will consequently be used to determine missing raw data in the k-space matrix. For reduction of artifacts in the image data, it is advantageous for the reference data and the raw data to have at least similar imaging characteristics. An imaging characteristic specifies how an external influence, such as an inhomogeneity of the basic magnetic field, influences the acquisition and/or the reconstruction of data. The imaging characteristic of an MR control sequence is determined, for example, by the sampling scheme used to enter data into k-space, i.e. by the order of the acquisition of the k-space data. Since the reference data typically are from an MR signal entered a, or at least one, position of k-space at which no raw data will be acquired, the sampling schemes for the recording of the raw data and the reference data differ. It is consequently advantageous to design the sampling schemes for the recording of the raw data and the reference data such that the two data sets will be similarly influenced by an external influence such as an inhomogeneity of the basic magnetic field, i.e. a frequency deviation. This characteristic is especially important when, in the reconstruction, in addition to the information contained in the reference data about the coil sensitivities, symmetry characteristics are also exploited, such as in the "Virtual Conjugate Coils" method mentioned above.

Distinct artifacts can occur in echo planar imaging (EPI) in combination with parallel imaging. EPI, by comparison with other MR control sequences, is especially dependent on frequency deviations (e.g. as a result of susceptibility-induced faults of the homogeneity of the basic magnetic field): Even a few tens of Hertz frequency deviation can lead to a shift of several pixels in the EPI image data, which in k-space typically corresponds to an overlaid phase variation. A frequency deviation is a typical external influence on an imaging characteristic of an MR control sequence. For example, if the reference data exhibit a lower sensitivity to frequency deviations than the raw data, then the result can be a smaller phase variation in the reference data, and the algorithm for parallel imaging is subject to the lower sensitivity to frequency deviations. This can lead to artifacts in the images during the reconstruction of the image data by an algorithm for parallel imaging.

The following methods for recording reference data are especially known for EPI.

The sampling scheme of EPI can be designed such that the segmentation of k-space, as used for the acquisition of the raw data, is transferred to the acquisition of the reference data. For example, if undersampled raw data are recorded for the parallel imaging with an acceleration factor of two, such that rows of the k-space matrix with even numbers are acquired while rows with odd numbers are left out, then this segmentation of k-space can be transferred to the acquisition of the reference data. The representative section of k-space to be recorded for the reference data can be segmented in a similar way, by a first block, containing rows with even numbers of the representative section of k-space to be recorded, serving as the reference data. The rows with odd numbers are acquired in a second block. An MR control sequence can be divided into a number of blocks, wherein the duration of a block typically corresponds to the repetition time that specifies the duration between two excitation pulses, which follows the acquisition of the same examination region of associated MR signals. After conclusion of the MR control sequence, the sum of all segments contains all reference data required for the reconstruction. The phase evolution of the reference data and of the raw data preferably matches. The advantage of this method is that with such a segmentation the reference data and the raw data exhibit the same imaging characteristics with respect to a frequency deviation, and thus no reconstruction artifacts occur. The disadvantage of this method is that it exhibits a high sensitivity to movement, since the recording of the reference data extends over several blocks due to the segmentation. The movement sensitivity specifies how sensitive the method is to a movement of the examination object, especially of the examination region.

In a further method for recording the reference data, the representative section of k-space is for the reference data is recorded by EPI after a single excitation, i.e. by one block of the MR control sequence. For example, all rows of the representative section of k-space are recorded in ascending order. Consequently there is no segmentation of the reference data analogous to the sampling scheme for the acquisition of the raw data. The raw data are accordingly not completely recorded in accordance with the sampling scheme's acceleration factor. The advantage of this method is that it exhibits a low sensitivity to movement because of the compact acquisition of the reference data. A disadvantage of the method is that the imaging characteristics of the reference data and of the raw data can be different because of the different segmentation, which can lead to reconstruction artifacts with external influences such as frequency deviation.

FLEET ("fast low-angle excitation echo-planar technique", e.g. Polimeni et al., "Reducing Sensitivity Losses Due to Respiration and Motion in Accelerated Echo Planar Imaging by Reordering the Autocalibration Data Acquisition", doi 10.1002/mrm.25628, MRM 2015) describes a further method for recording the reference data. The reference data are acquired segmented, preferably in a similar manner to the segmentation of the raw data, and the undersampled segments of the reference data are recorded at short intervals one after another by an echo planar sampling scheme. The sum of the segments contains all required reference data. Here the flip angle of the excitation pulses is modulated from segment-to-segment such that contrast variations between the segments are minimized. The fast recording of the reference data produces a low movement sensitivity of the method. Furthermore, during correct segmentation the reference data and the raw data exhibit the same imaging characteristics, which is why in this regard no reconstruction artifacts occur. However contrast variations between the segments can only be minimized for one type of tissue, which is defined by its T1- and T2-relaxation times. In tissues with strongly deviating relaxation times, segmentation artifacts occur, which lead to reconstruction errors within the framework of the parallel imaging.

SUMMARY OF THE INVENTION

An object of the invention is to provide a method for reconstruction of image data of an examination object from undersampled raw data and reference data, which reduces reconstruction artifacts as a result of a difference between the raw data and the reference data created by a disturbance variable. It is also an object of the invention to provide a magnetic resonance apparatus and a non-transitory, computer-readable data storage medium that are designed to implement such a method.

In the inventive method for reconstruction of image data of an examination object from undersampled raw data and reference data, the undersampled raw data are recorded (acquired) from an examination region of an examination subject by operating an MR scanner so as to execute MR control sequence, to which a reconstruction algorithm for the reconstruction of image data from the raw data is assigned.

A disturbance variable in the examination region is determined in a computer, and a first modulation function, which describes the influence of the disturbance variable on the MR control sequence is established in the computer. Modulated reference data are created in the computer on the basis of the modulation function and the reference data such that the modulated reference data are subjected by the modulation function to the influence of the disturbance variable on the raw data recorded by the MR control sequence. A combination algorithm is executed in the computer to reconstruct the undersampled raw data, with the use of the modulated reference data, into image data.

The method serves to reconstruct image data from data that were acquired from an examination object by a magnetic resonance scanner. An examination object can be a test person, a patient or a measurement phantom. The region of the examination object to be shown as an image on the basis of the examination can be referred to as the overall region. The examination region preferably is a subset of the overall region. The examination region is preferably selected such that the required raw data and reference data for application of the inventive method to the examination region are present separately from that of the overall region or can be separated therefrom. Preferably the examination region is the smallest unit of the overall region that can be defined in this way. Typically in two-dimensional MR imaging the examination region is one slice.

First, a disturbance variable is determined for the examination region. The disturbance variable is typically a measure of an influence on the imaging characteristic of an MR control sequence. For example, the disturbance variable can be a measure of the homogeneity of the basic magnetic field of the magnetic resonance scanner in the examination region, or reflect the higher-order magnetic fields accompanying the magnetic field gradients. The disturbance variable, for example, can be a representative scalar for the examination region or can be a spatial distribution in the examination region.

Furthermore, a modulation function is established. The modulation function describes the influence of the established disturbance variable on the MR control sequence. In this case, the modulation of the raw data as a result of the disturbance variable, also the change of the raw data compared to the raw data recorded by the MR control sequence in the absence of the disturbance variable, is taken into account. In addition to the influence of the disturbance variable on the MR control sequence, i.e. the process for acquisition of the raw data, the modulation function can take account of the influence of the disturbance variable on the reconstruction process, by taking account of the effects of the disturbance variable on the reconstruction algorithm. Preferably such a modulation function is established so as to include the influence of a disturbance variable on the acquisition by the MR control sequence and on the reconstruction by the first reconstruction algorithm. It is known, for example, that the field terms, resulting from the Maxwell equations, accompanying the magnetic field gradients create temporary magnetic fields dependent on the MR control sequence, which lead to distortions, i.e. can influence the imaging characteristics. This is especially the case in EPI. The effect of the field terms accompanying the magnetic field gradients on EPI as the MR control sequence will be taken into account in the associated modulation function.

Preferably the modulation function is designed such that it has a first parameter for a disturbance variable and/or a second parameter for raw data. Individually acquired and/or established values for the first and/or second parameter can be inserted into the modulation function, on the basis of which the modulation function creates the modulated reference data from the reference data. Such a modulation function can have been determined once, in advance, for the MR control sequence and provided to the computer. As an alternative, the computer can be provided with an establishment algorithm for determining the modulation function as a function of the established disturbance variable and/or the acquired raw data, and optionally as a function of the MR control sequence. This establishment algorithm can be executed to establish the modulation function. Since the modulation function is dependent on the disturbance variable, the modulation function is tailored to the examination region. If the inventive method is applied for a further examination region, then the modulation function that is valid for the further examination region can differ from the modulation function that is valid for the original examination region.

When the modulation function is applied to the reference data, then modulated reference data are created. The modulated reference data exhibits the type of distortions as would have occurred during recording of the reference data by execution of the MR control sequence in the scanner. Thus, by the application of the modulation function, the imaging characteristics of the MR control sequence are preferably simulated or reproduced for the reference data. In particular, the sensitivity with respect to the disturbance variable, which is valid during data acquisition with the MR control sequence, can be transferred to the reference data. The phase evolution of the MR control sequence thus can be impressed onto the reference data.

The combination algorithm for reconstruction of the image data from the undersampled raw data and the modulated reference data is designed to make the image data reconstructed by the combination algorithm correspond as best as possible to the data that would have been produced during application of the reconstruction algorithm to completely sampled raw data. Accordingly, the combination algorithm can be a completion algorithm, which reduces the effects of the incomplete k-space matrix that exists as a result of the undersampling of the reference data. Suitable completion algorithms can be of the type that are employed in parallel imaging or in partial Fourier reconstruction methods. Furthermore, the combination algorithm can be a further algorithm based on the reconstruction algorithm, which reconstructs data created by the completion algorithm into image data. The completion algorithm and the further algorithm can be integrated with each other.

The method is not restricted to the establishment and the use of a single disturbance variable. Two or more disturbance variables influencing the imaging characteristics can also be determined. In this case, the modulation function is established so as to describe the influence of the two or more disturbance variables on the first MR control sequence. The modulated reference data in this case are subjected by the modulation function to the influence of the two or more disturbance variables on the raw data recorded by the MR control sequence.

An advantage of the inventive method for the reconstruction of image data from undersampled raw data and reference data is that the imaging characteristics of the reference data can be adapted to the imaging characteristics of the MR control sequence with respect to a disturbance variable. This enables reconstruction artifacts resulting from a difference between the raw data and the reference data, created by the disturbance variable, to be reduced. Accordingly, the inventive reconstruction method creates image data of high quality largely independently of the disturbance variable. Deviating imaging characteristics that might occur, which are produced by the acquisition and/or reconstruction process for the reference data, and by the acquisition and/or reconstruction process for the raw data, can be compensated. The option of compensating respectively different sensitivities of the raw data and the reference data to the disturbance variable can also be exploited for a higher flexibility in the choice of sampling schemes and/or MR control sequences for the reference data and for the raw data.

In an embodiment of the method, the aforementioned MR control sequence is a first MR control sequence and the reconstruction algorithm is a first reconstruction algorithm, and the reference data are reference image data that are reconstructed from reference raw data recorded by execution of a second MR control sequence by the scanner, using a second reconstruction algorithm assigned to the second MR control sequence, and the combination algorithm is formed by the first reconstruction algorithm and an algorithm for an image-based parallel MR imaging technology.

The acquisition of the reference raw data, which will be reconstructed by the second reconstruction algorithm into reference image data in the image space, is undertaken in k-space. As is known in MR imaging, the second MR control sequence typically determines the acquisition process and the imaging characteristics of the reference data. The second MR control sequence can be integrated into the first MR control sequence, or is preferably called by the latter and started. The second MR control sequence can feature the same basic elements as the first MR control sequence. A basic element is typically determined by the order of pulses of a specific type for acquisition of an MR signal. The second MR control sequence typically differs from the first with respect to the points of the k-space matrix to be recorded (filled). In general, the second MR control sequence can be selected independently of the first MR control sequence. The task of the second MR control sequence is the acquisition of the required reference raw data.

Furthermore, the second MR control sequence is preferably selected such that the duration of the acquisition of the reference raw data is negligible when compared to the duration of the acquisition of the raw data. The second MR control sequence is preferably selected such that it is insensitive to movement of the examination object. This is typically achieved by a compact acquisition of the reference raw data that is not interrupted by the acquisition of the raw data. Preferably the reference image data does not exhibit any artifacts, or only artifacts induced by a disturbance variable. The second MR control sequence is preferably selected such that the image data reconstructed by the use of the reference data, after reconciliation of the imaging characteristics in accordance with the inventive method, do not exhibit any artifacts.

The first modulation function is designed in this embodiment of the method such that it can be applied to the reference image data in the image space (image domain). The modulated reference data resulting therefrom are preferably available in the image space. The combination algorithm is an algorithm, preferably a completion algorithm, which can implement an image-based parallel MR imaging technique. A typical example of an algorithm for an image-based parallel MR imaging technique is the SENSE algorithm. In this algorithm, the incompleteness of the raw data resulting from the undersampling is corrected in the image space. For this purpose, the first reconstruction algorithm is applied to the raw data preferably before use of the completion algorithm, so that this reconstruction will produce distorted (erroneous) image data. The completion algorithm is preferably designed to correct the distorted image data on the basis of the reference data. This correction is done in accordance with this embodiment in the image space.

An advantage of this embodiment of the method is that known image-based reconstruction algorithms for undersampled raw data can be integrated into the method. Since the first reconstruction algorithm will typically be used for the reconstruction of fully sampled raw data, and in this embodiment of the method will be employed in conventional image-based parallel imaging, the combination algorithm can also be applied to the raw data and the reference data without using the modulation function to create the modulated reference data. Compared to conventional methods, the determination of the disturbance variable and the modulation function, as well as the creation of the modulated reference data, take place in the inventive method. Consequently the inventive method in this embodiment is easy to integrate into a conventional method. Compared to the conventional method, the inventive method makes it possible to compensate for reconstruction artifacts that occur due to a difference between the raw data and the reference data created by a disturbance variable. Accordingly more flexibility in the selection of the second MR control sequence can be obtained. The uniform sensitivity to the disturbance variable of the first and second MR control sequence does not need to be considered in the selection of the MR control sequences. Instead, the second MR control sequence can be selected such that the reconstruction of the image data is not sensitive to further external influences, such as movement of the examination object. The second MR control sequence can be selected such that artifacts in the image data will be minimized. For this purpose, the reference data can be acquired segmented. For example, as a result of the flexible selection option, a second MR control sequence can be selected such that contrast variations can be eliminated as a function of relaxation times of a tissue type. Examples of this type of second MR control sequence are gradient echo sequences, and echo planar imaging techniques, without segmentation.

In another embodiment of the method, the reference data are reference raw data recorded by execution of a second MR control sequence, to which a second reconstruction algorithm for the reconstruction of reference image data from reference raw data is assigned, and the combination algorithm is an algorithm for a k-space-based parallel MR imaging technique. The reference data are accordingly present in k-space, preferably in the form as acquired by the second MR control sequence. A second reconstruction algorithm for reconstruction of the associated reference image data is available, which can optionally be executed. The second magnetic resonance sequence can also be determined in this embodiment independently of the first MR control sequence. Characteristics and tasks of the second MR control sequence apply similarly to the embodiments already presented.

The first modulation function is designed to characterize the imaging characteristics with the reference data of the first MR control sequence. In this embodiment, the modulation function is preferably embodied such that it modulates the reference raw data present in k-space. The first modulation function can carry out the modulation in k-space and/or include a transformation algorithm for transformation of the reference raw data in the image space. If, for example, the disturbance variable reflects a global frequency deviation, i.e. a frequency deviation that is uniform over the entire examination region, then the modulation for this disturbance variable can intuitively be undertaken in k-space. The modulated reference data in accordance with this form of embodiment is preferably present in k-space.

The combination algorithm is an algorithm, in particular a completion algorithm, which can carry out a k-space-based parallel MR imaging technique. A typical example of an algorithm for an image-based parallel MR imaging technique is the GRAPPA algorithm. In this algorithm, the incompleteness of the raw data produced by the undersampling is corrected in k-space. The k-space-based completion algorithm is preferably designed to combine the raw data with the modulated reference data such that the k-space matrix can be completed. The data of the completed k-space matrix can be reconstructed by the first reconstruction algorithm into image data, provided that the combination algorithm includes the first reconstruction algorithm or an algorithm based thereon.

An advantage of this embodiment of the method is the fact that known k-space-based reconstruction algorithms for undersampled raw data can be integrated into the method. This embodiment of the inventive method is easy to integrate into a conventional reconstruction method, in particular when the modulated reference data are present in k-space. Furthermore the aforementioned advantages, because of the flexible selection option, apply to the second MR control sequence.

In another embodiment of the method, the reference image data are reconstructed from the reference raw data by the second reconstruction algorithm, from which modified reference data are created on the basis of the first modulation function, and an inverse of the second reconstruction algorithm creates the modulated reference data from the modified reference data.

This embodiment of the method makes it possible to apply the modulation function in the image space to the reference image data. If the reference data are present as reference raw data, then these data can be reconstructed by the second reconstruction algorithm into reference image data. The modulation function can accordingly create modified reference data from the reference image data, which are present in the image space. In order to guarantee the functionality of the k-space-based combination algorithm, a back transformation of the modified reference data to modulated reference data, which is present in k-space, takes place. The combination algorithm can accordingly be applied as in conventional parallel imaging, with the difference that this is provided with modulated reference data.

In accordance with this embodiment, the first modulation function can be carried out in the image space, even when a k-space-based parallel reconstruction technique is used in the further method. The back transformation of the modified reference data in k-space means that no adaptation of the first modulation function to the combination algorithm is necessary. As in the use of the image-based combination algorithm, the first modulation function can operate in the image space. This can accordingly be used in the inventive method independently of the combination algorithm that is used. A further advantage of this embodiment is that an adaptation of the imaging characteristics in the image space can typically occur more intuitively in k-space. For example a spatial distortion in the encoding direction is able to be carried out more intuitively than in k-space. Depending on the imaging characteristics to be adapted, i.e. dependent on the first and second MR control sequences, a transformation of the reference raw data in the image space can be required independently of the combination algorithm, which this embodiment makes possible.

In another embodiment of the method, a second modulation function is established, which describes the influence of the disturbance variable on the second MR control sequence and the modulated reference data are created on the basis of the first modulation function and on the basis of the second modulation function such that the influence of the disturbance variable on the reference data is eliminated as a result of the second MR control sequence.

Where the acquisition of the reference raw data is influenced by means of the second MR control sequence by a disturbance variable, the effect of the disturbance variable can be revised by the second modulation function. Similarly to the first modulation function, the second modulation function describes the influence of the established disturbance variable on the second MR control sequence. The method for establishment and the preferred parameter dependency described for the first modulation function apply to the second modulation function.

A distortion of the reference data occurring as a result of a disturbance variable can be remedied by the second modulation function with knowledge of the disturbance variable. The modulated reference data after application of the first and the second modulation functions, preferably in addition to the imaging characteristics of the first MR control sequence, does not exhibit any effects of a disturbance variable. The first and the second modulation functions can be applied independently of one another. It is also conceivable, instead of the first modulation function, for the second modulation function to be applied. The advantage of this embodiment is that the image data will not be influenced by the change of the reference data occurring because of a disturbance variable. The reconstruction method can be improved by this method, because reconstruction artifacts because of the distorted reference data are eliminated.

In another embodiment of the method, the first MR control sequence, compared to the second MR control sequence, exhibits a higher sensitivity to a disturbance variable. The sensitivity of an MR control sequence to a disturbance variable specifies the degree to which the acquisition of the raw data is influenced by the disturbance variable. If the first MR control sequence exhibits a disproportionately high sensitivity, for example, then it is especially important for the completion of the k-space matrix for the reference data used to exhibit the same sensitivity. This is achieved by the transmission of the imaging characteristics of the first MR control sequence to the reference data, by the first modulation function. The greater the difference is between the sensitivities of the first and the second MR control sequences, typically the stronger the artifacts in the image data after reconstruction by the combination algorithm from the reference data and the raw data. Consequently, an application of the inventive method can be especially advantageous for these MR control sequences.

In another embodiment of the method, the first MR control sequence is designed to carry out EPI, and/or the second MR control sequence is a gradient echo sequence. EPI is a typical example for MR data acquisition, which is accelerated in everyday clinical practice with parallel imaging techniques. It is known that the imaging characteristics of EPI, because of the sampling schemes used therein, can be significantly influenced by external influences, such as an inhomogeneity of the basic magnetic field or the higher order field terms accompanying the magnetic field gradients. Were an EPI to have been employed as the second MR control sequence for acquisition of the reference data, then no further modulation would be necessary for adapting the imaging characteristics, provided the segmentation of the reference raw data were to occur similarly to the segmentation the raw data. However, such an approach would have a high movement sensitivity. A further method (FLEET) typically changes the contrast of the image data. It has further been recognized that the alternating magnetic fields for frequency encoding of residual asymmetries typical for the EPI can be created in the reference data. In the reconstruction of the reference raw data into reference image data these residual asymmetries can create ghost images and/or create reconstruction artifacts in the reference image data. It has further been recognized that, when the inventive method is carried out, the first and the second MR control sequence can be different. This is possible by the inventive method being able to compensate for the different imaging characteristics.

A gradient echo sequence is typically characterized by a short recording duration with short repetition time and consequently by a small sensitivity to movement when compared to segmented EPI. The reference data can likewise exhibit a small sensitivity to movement, when these data are recorded with a gradient echo sequence with a long repetition time and an averaging over a greater period of time occurs. A gradient echo sequence typically creates magnetic field gradients for frequency encoding of the same polarity, through which residual asymmetries can be avoided. Furthermore a contrast variation of the image data can be avoided and the imaging by means of a gradient echo sequence, when compared to EPI, will typically be influenced less strongly by a disturbance variable. Consequently the use of a gradient echo sequence for the acquisition of reference data is especially advantageous.

In another embodiment of the method, the disturbance variable is determined in the examination region in the form of a spatial distribution. The disturbance variable representative for the examination region accordingly is composed of at least two values, which are each assigned to a partial area of the examination region. Preferably the disturbance variable has a value for each pixel to be represented in the examination region, which specifies a representative measure for the external influence described by the disturbance variable at the position of the pixel. In the determination of the modulation function, locally different values of the disturbance variable can accordingly be taken into account. This enables the imaging characteristics of the first MR control sequence to be determined more exactly, through which the quality of the image data can be improved.

In another embodiment of the method, the disturbance variable has been established before recording of the raw data in an adjustment measurement and is provided to the computer. Typically, before the application of an MR control sequence, in particular an EPI sequence, an adjustment measurement is carried out, in order to make a correction for imperfect homogenization of the basic magnetic field and/or in order to determine the mid-frequency for the radio-frequency antenna unit based on the average strengths of the basic magnetic field in the examination region. Such data typically contain information from which a typical disturbance variable, for example a frequency deviation, can be determined, if necessary as a spatial distribution. The advantage of such a determination of the disturbance variable is that no separate measurement is required, which enables the duration of the examination to be shortened.

In another embodiment of the method, the disturbance variable is established from the raw data. Depending on the first MR control sequence the raw data can be procured such that a disturbance variable that is representative for the examination region can be established. For example, raw data can be recorded by a first MR control sequence with differently oriented directions of the phase encoding, from which a frequency deviation can be established in accordance with "A Technique for Accurate Magnetic Resonance Imaging in the Presence of Field Inhomogeneities" (H. Chang, J. Fitzpatrick, IEEE Trans. Med. Imaging, 11:319 (1992)).

In a further example, the raw data can be reconstructed by the first reconstruction algorithm and the reference raw data can be reconstructed by the second reconstruction algorithm. The resulting data are present in the image space, but in accordance with the first and the second MR control sequences, are subject to different imaging characteristics. Through a comparison of the data resulting from the reference raw data and raw data, the influence of the disturbance variable on the first and the second MR control sequences can be determined, from which, if necessary, the causal disturbance variable can be determined.

An advantage of this embodiment is fact that the determination of the disturbance variable can be done on the basis of existing data. Since no separate measurement is required, the duration of the examination preferably is maintained in this embodiment.

In another embodiment of the method, the disturbance variable is determined from distorted image data, which are reconstructed from the undersampled raw data and reference data using the combination algorithm. In this embodiment, the disturbance variable is determined on the basis of the reference data and raw data established within the framework of the method. The distorted image data can be created by the conventional application of the combination algorithm, excluding the modulation function. The disturbance variable can be determined from the image data distorted and possibly affected by artifacts. This embodiment of the inventive method is preferably used in the case of a spatially distributed disturbance variable, which for example one that quantifies an inhomogeneity of the basic magnetic field. For example, a first MR control sequence, which acquires the raw data in multiple recording repetitions, can carry out the multiple recordings of the raw data with slightly different echo times. From the resulting phase differences, conclusions can be made about local deviations of the homogeneity of the basic magnetic field, such as described in "Correction for Geometric Distortion and N/2 Ghosting in EPI by Phase Labeling for Additional Coordinate Encoding (PLACE)" (Q-S. Xiang, F. Q. Ye, MRM 57:731 (2007)). The disturbance variable can be used in the further method.

The disturbance variable can also be determined iteratively based on this method. After reconstruction of the image data, the image data are included in the determination of a further disturbance variable. Based on the further disturbance variable, using a (preferably) newly determined modulation function, the further image data can be reconstructed. This process can be repeated iteratively.

An advantage of this embodiment is fact that the disturbance variable can be determined with high precision, so no further measurement is required. The quality of the image data can be improved by this approach. The iterative repetition of the method can additionally increase the accuracy of the determined disturbance variable without lengthening the duration of the examination.

In another embodiment of the method, the disturbance variable is a frequency deviation. The frequency deviation is a typical measure of a deviation of the homogeneity of the basic magnetic field of the magnetic resonance device, with which it correlates linearly. The determined frequency deviation is composed of one or more values, which are preferably representative for the examination region under considered. The frequency deviation is preferably present in the form of a spatial distribution, i.e. spatially resolved in the examination region.

A frequency deviation can influence the MR imaging in different ways; in particular different encoding methods are affected thereby. For example, in EPI a local frequency deviation $\Delta f$ can lead to a local image shift $\Delta y=\Delta f/BW$ in the direction of the phase encoding. BW in this example stands for the pixel bandwidth in the direction of the phase encoding, which is given for EPI by the reciprocal duration of the readout train. Further distortions can occur during the frequency encoding or slice selection in the two-dimensional MR imaging. The influence of a frequency deviation on the imaging characteristics of an MR control sequence is accordingly varied. Taking account of the frequency deviation in the form of a disturbance variable in accordance with the inventive method can accordingly reduce wide-ranging reconstruction artifacts.

The invention furthermore encompasses a magnetic resonance apparatus with a computer that includes a reconstruction processor. The reconstruction processor is configured to carry out the inventive method for a reconstruction of image data of an examination object from undersampled raw data and reference data. For this purpose the reconstruction processor has an input via which the reconstruction processor is provided with the undersampled raw data, the reference data, the first and, if necessary, the second reconstruction algorithm(s). Further functions, algorithms or parameters needed in the method can be provided to the reconstruction processor via the input. The reconstruction processor is configured to determine a disturbance variable, to establish a first modulation function, to create modulated reference data, and to execute a combination algorithm. The reconstructed image data are provided via the output in electronic form as a data file. The reconstruction processor can be integrated into the magnetic resonance apparatus. The reconstruction processor can also be installed separately from the magnetic resonance apparatus. The reconstruction processor can be connected to the magnetic resonance apparatus.

Embodiments of the inventive magnetic resonance apparatus correspond to the embodiments of the inventive method. The magnetic resonance apparatus can also have control components that are needed and/or are advantageous for carrying out the inventive method. The magnetic resonance apparatus can also be designed to send control signals and/or for receiving and/or for processing control signals, in order to carry out the inventive method. Preferably the reconstruction processor is part of the control computer of the inventive magnetic resonance apparatus. Computer programs and further software can be stored in a memory of the reconstruction processor, by which the reconstruction processor automatically controls and/or executes the inventive method.

The present invention also encompasses a non-transitory, computer-readable data storage medium encoded with programming instructions (program code) that, when the storage medium is loaded into a computer or computer system of a magnetic resonance apparatus, cause the computer to operate the magnetic resonance apparatus in accordance with any or all embodiments of the method as described above. The computer requires appropriate memory, an appropriate graphics card, and a suitable processor or logic unit in order to implement the above-described method steps efficiently.

Examples of electronically-readable data carriers are a DVD, a magnetic tape or a USB stick, on which electronically-readable control information, especially software, is stored. When this control information (software) is read from the data carrier and is stored in a controller and/or calculation unit of a magnetic resonance device, all inventive forms of embodiment of the previously described method can be carried out.

The advantages of the inventive magnetic resonance apparatus and the computer-readable data storage medium essentially correspond to the advantages of the inventive method as described in detail above. Features, advantages and alternative embodiments mentioned above can likewise be transferred to the other aspects of the invention.

BRIEF DESCRIPTION OF THE DRAWINGS

FIG. 6 is a flowchart of a fourth embodiment of the inventive method.

DESCRIPTION OF THE PREFERRED EMBODIMENTS

Figure 1:
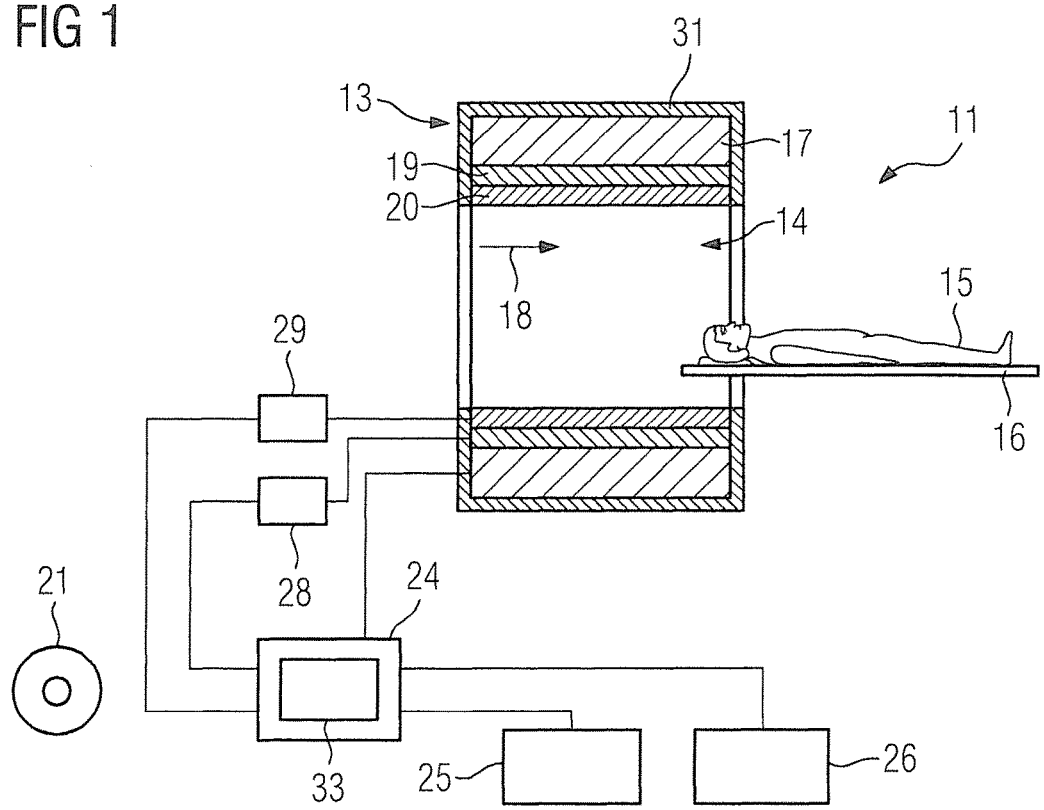
FIG. 1 is a block diagram of an inventive magnetic resonance apparatus.

FIG. 1 shows, in a block diagram, an inventive magnetic resonance apparatus 11 for carrying out the inventive method. The magnetic resonance apparatus 11 has an MR data acquisition scanner 13 with a basic field magnet 17 for creating a strong and constant basic magnetic field 18. The scanner 13 has a cylindrical patient receiving area 14 for receiving a patient 15. The patient receiving area 14 is cylindrical and is circumferentially surrounded by the scanner 13. The patient 15 can be moved by a patient support 16 into the patient receiving area 14. To this end the patient support 16 has a support table, which is movable within the scanner 13. The scanner 13 is shielded from the outside by a housing shell 31.

The scanner 13 further has a gradient coil arrangement 19 to create magnetic field gradients, which are used for spatially encoding the MR signals during imaging. The gradient coil arrangement 19 is activated by a gradient controller 28. Furthermore the scanner 13 has a radio-frequency antenna 20, which, in the case shown, is a body coil permanently integrated into the scanner 13. The radio-frequency antenna 20 is activated by a radio-frequency antenna controller 29 so as to radiate radio-frequency magnetic resonance sequences into an examination area, which is essentially formed by the patient-receiving area 14. The radio-frequency magnetic resonance sequences excite certain nuclei in the patient 15 so as to cause nuclear spins of the excited nuclei to be deflected from the alignment produced by the basic magnetic field 18. As the deflected nuclear spins return to the steady state, they emit radio-frequencies signals known as magnetic resonance signals. These magnetic resonance signals are detected by the radio-frequency antenna 20. For this purpose, the radio-frequency antenna 20 may have separate, and a separately operated, transmission coils and reception coils.

For control of the basic field magnet 17, the gradient controller 28 and the radio-frequency antenna controller 29, the magnetic resonance apparatus 11 has a control computer 24. The control computer 24 centrally controls the magnetic resonance apparatus 11, such as executing MR control sequences. Control information, such as imaging parameters, as well as reconstructed magnetic resonance images, can be made available for a user on a display unit 25, for example on at least one monitor, of the magnetic resonance apparatus 11. The magnetic resonance apparatus 11 has an input unit 26, via which information and/or imaging parameters can be entered by a user during a measurement process. The control computer 24 can include the gradient controller 28 and/or the radio-frequency antenna controller 29 and/or the display unit 25 and/or the input unit 26. The control computer 24 further has a reconstruction processor 33. The magnetic resonance apparatus 11 is thus designed, together with the reconstruction processor 33, for carrying out the inventive method.

The magnetic resonance apparatus 11 shown can of course have further components that magnetic resonance apparatuses usually have. The general manner of operation of a magnetic resonance apparatus is known to those skilled in the art, so a more detailed description of such operation and the further components is not necessary herein.

The method described herein can be provided in the form of a non-transitory, computer-readable data carrier (storage medium) 21 with electronically-readable control information (code) stored thereon. When the data carrier 21 is loaded in a control computer 24, the code is appropriately distributed and executed so as to cause the inventive method to be implemented.

The embodiments one to four of the inventive method presented in FIGS. 2 to 6 use, as an example and for straightforward presentation, a frequency deviation 40 as the disturbance variable 40 to be established and to be used in the method. The disturbance variable, however, in practice can also reflect another factor that influences an MR control sequence.

Figure 2:
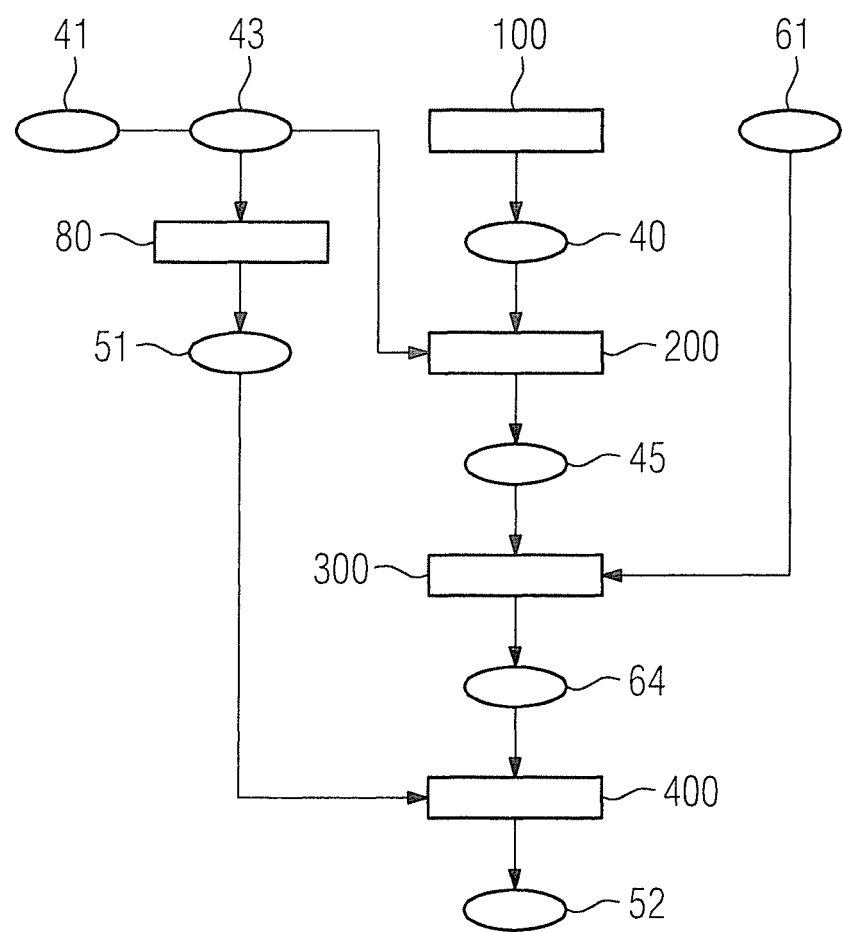
FIG. 2 is a flowchart of a first embodiment of the inventive method.

FIG. 2 is a flowchart of a first inventive method for a reconstruction of image data 52 from undersampled raw data 51 and reference data 61. The method is carried out by the reconstruction processor 33 of the magnetic resonance apparatus 11. At the beginning of the method in this case the reference data 61 and the undersampled raw data 51 are present, which have been recorded in an examination region of the examination object with the use of a first MR control sequence 43, to which a first reconstruction algorithm 41 for the reconstruction of image data 52 from raw data 51 is assigned. The raw data 51 are preferably recorded in a method step 80 undertaken before the rest of the method for a reconstruction. The basic part of the inventive method begins with method step 100, determining a frequency deviation 40 in the examination region. The frequency deviation 40 in the examination region can be determined in the form of a spatial distribution. The frequency deviation 40 can also have been established before recording of the raw data in an adjustment measurement and provided to the reconstruction processor 33 in method step 100. In general a measure for the homogeneity of the basic magnetic field 18, which is usually a larger region than the examination region, can have been established in advance. This measure can be provided for the reconstruction processor 33, which in method step 100, on the basis of the measure provided, establishes the frequency deviation 40 for the examination region. The measure can be, for example, the spatial distribution of the field strength of the basic magnetic field 18. On the basis of the average field strength of the basic magnetic field 18 in the examination region, which corresponds to the set average frequency of the radio-frequency antenna controller 29, the frequency deviation 40 can be established from the difference between the measure and the average field strength.

In method step 200, a first modulation function 45 is established, which describes the influence of the frequency deviation 40 on the first MR control sequence 43.

On the basis of the first modulation function 45 and the reference data 61, in method step 300, reference data 64 are created modulated such that the modulated reference data 64 are subjected to the influence of the frequency deviation 40 on the raw data 51 recorded by means of the first MR control sequence 43. In concluding method step 400, a combination algorithm is executed, wherein the undersampled raw data 51 are reconstructed with the use of the modulated reference data 64 into image data 52, and made available as a data file.

Figure 3:
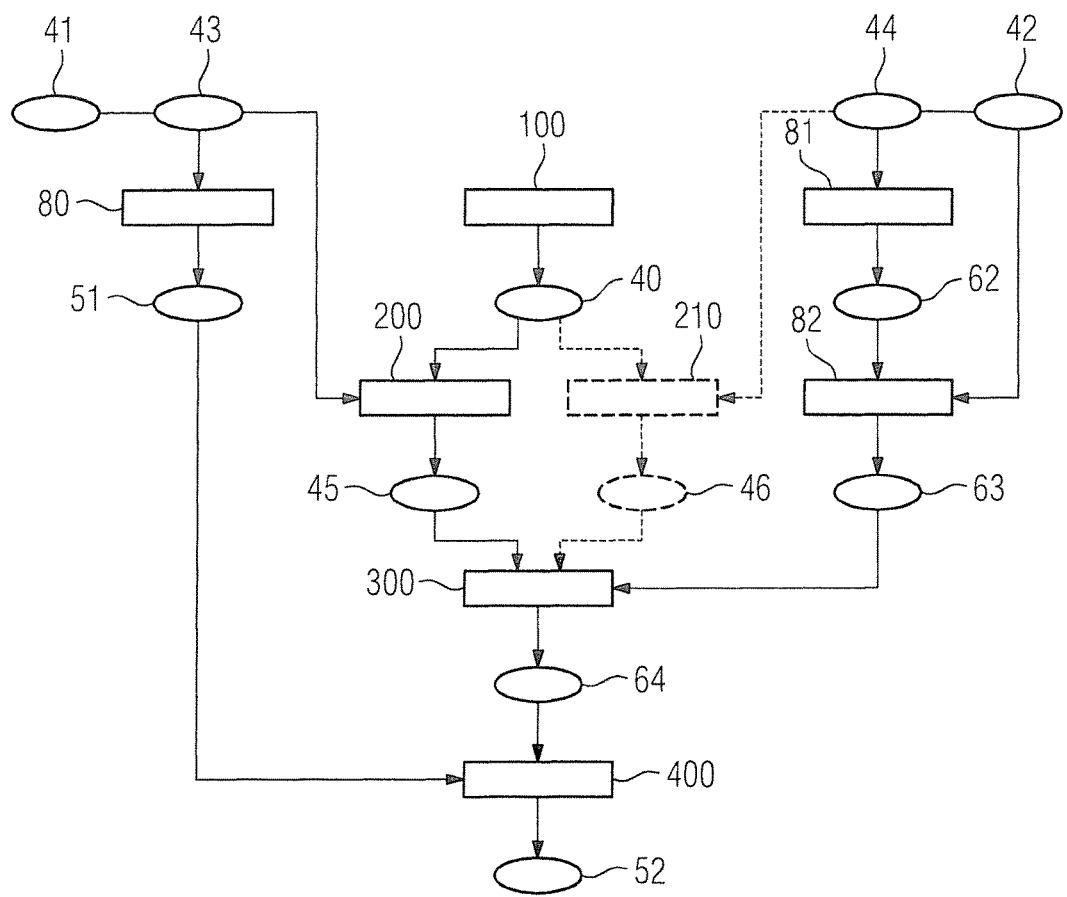
FIG. 3 is a flowchart of a second embodiment of the inventive method.

FIG. 3 is a flowchart of a second embodiment of an inventive method. Here the reference data 61 are the reference image data 63. The reference image data 63 are preferably created in the method steps 81 and 82 preceding the inventive method for reconstruction. Preferably a second MR control sequence 44 is present, to which a second reconstruction algorithm 42 is assigned. In method step 81, reference raw data 62 are recorded by execution of the second MR control sequence 44, which, in method step 82, is reconstructed into reference image data 63 by using the second reconstruction algorithm 42. In this embodiment of the inventive method, the reference image data 63 are used instead of the reference data 61 for the creation of the modulated reference data 64.

The method begins with method step 100, the determination of a frequency deviation 40 in the examination region. In method step 200 a first modulation function 45 is established, which describes the influence of the frequency deviation 40 on the first MR control sequence 43.

Additionally, a second modulation function 46 can optionally be established in method step 210, based on the frequency deviation 40 and the second MR control sequence 44, which describes the influence of the frequency deviation 40 on the second MR control sequence 44. In the following method step 300, the modulated reference data 64 is created on the basis of the first modulation function 45, as described in FIG. 2 and in addition optionally on the basis of the second modulation function 46. The second modulation function 46 can have the effect, in method step 300, of eliminating the influence of the frequency deviation 40 on the reference data 61, i.e. on the reference image data 63, as a result of the second MR control sequence 44.

In method step 400, the combination algorithm, which reconstructs the undersampled raw data 51 with the use of the modulated reference data 64 into image data 52, is executed. The combination algorithm is formed by the first reconstruction algorithm 41 and an algorithm for an image-based parallel MR imaging technique, for example a SENSE algorithm. If the first MR control sequence 43 and the second MR control sequence 44 exhibit different imaging characteristics with respect to the frequency deviation 40, then reconstruction artifacts can be eliminated on the basis of the different imaging characteristics.

Figure 4:
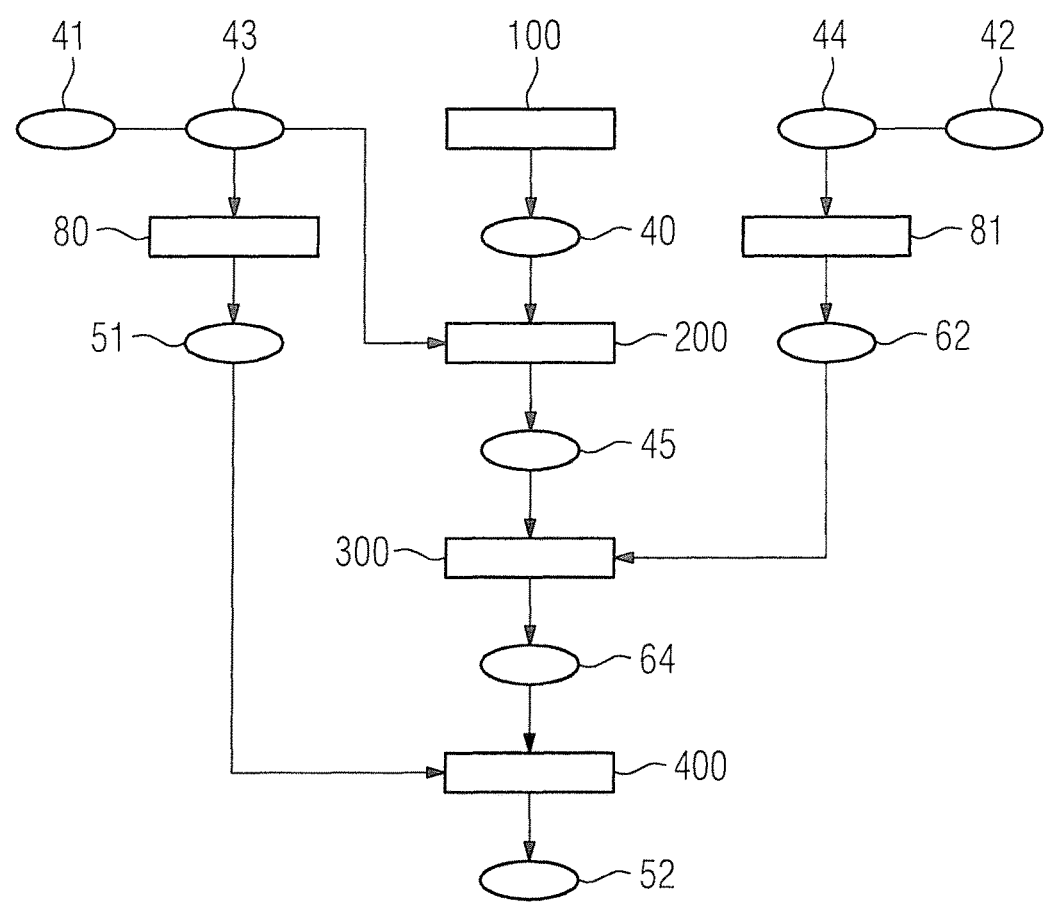
FIG. 4 is a flowchart of a third embodiment of the inventive method.

FIG. 4 is a flowchart of a third embodiment of an inventive method. The reference data 61 are reference raw data 62 in this embodiment. The reference raw data 62 are preferably created in the method step 81 preceding the inventive method for reconstruction. A second MR control sequence 44 is preferably present, to which a second reconstruction algorithm 42 is assigned. In method step 81, reference raw data 62 are recorded by execution of the second MR control sequence 44. In this embodiment of the inventive method, the reference raw data 62 are used instead of the reference data 61.

The method begins with method step 100, the determination of a frequency deviation 40 in the examination region. In method step 200 a first modulation function 45 is established, which describes the influence of the frequency deviation 40 on the first MR control sequence 43. On the basis of the first modulation function 45 and the reference image data 62, in method step 300, modulated reference data 64 is created such that the modulated reference data 64 is subjected to the influence of the frequency deviation 40 on the raw data 51 recorded by means of the first MR control sequence 43. In the concluding method step 400 a combination algorithm is executed, wherein the undersampled raw data 51 are reconstructed with the use of the modulated reference data 64 into image data 52. The combination algorithm is an algorithm for a k-space-based parallel MR imaging technique. If the first MR control sequence 43 and the second MR control sequence 44 exhibit different imaging characteristics with respect to the frequency deviation 40, then reconstruction artifacts can be eliminated on the basis of the different imaging characteristics.

The third embodiment will be explained in greater detail below with reference to an exemplary scenario.

The undersampled raw data 51 can be acquired for example within the framework of EPI in method step 80. The first MR control sequence 43 is accordingly designed for carrying out EPI. In EPI, the undersampling is typically employed to realize at least one of the following advantages:

Increasing the effective bandwidth for a pixel in the direction of the phase encoding, Reducing the number of recorded MR signals and/or the duration for sampling the k-space matrix, in order in particular to minimize the influence of relaxation effects, Shortening the echo time, i.e. shortening the time interval between excitation and the MR signal that encodes the center of the k-space matrix, Shortening the repetition time, i.e. shortening the duration between two excitation pulses, which are followed by the acquisition of MR signals belonging to the same examination region.

The undersampled raw data 51 are recorded in method step 80, for example with double undersampling. The effective bandwidth for a pixel in the direction of the phase encoding amounts to 10 Hz/pixel for example. Reference data 61 are typically needed to compensate for the effect of the incomplete k-space matrix, because of the undersampling, in the reconstruction of the image data. The alternating magnetic field gradients typical for frequency encoding for EPI can already create residual asymmetries in the reference data 61, which, upon reconstruction of the reference raw data 62 into reference image data, can create ghost images and/or artifacts in the reference image data. An MR control sequence insensitive to movement is also advantageous for the acquisition of the reference data 61.

In order to eliminate the influence of the residual asymmetries on the reference data 61, the reference data 61 can be recorded, for example, with a gradient echo method. A fast gradient echo sequence with short repetition time is an example of an MR control sequence insensitive to movement, which can advantageously be used as a second MR control sequence 44. If such a second MR control sequence 44 is selected for example with a high bandwidth per pixel, e.g. a few hundred Hertz, then the reference data 61 are almost free from distortions. Taking account of the influence of the frequency deviation 40 on the second MR control sequence 44 on the basis of a second modulation function 46 is thus not required in such a case. Furthermore such a second MR control sequence 44 is not sensitive with respect to movement of the patient 15. In this example the first MR control sequence 41 exhibits a higher sensitivity with respect to the frequency deviation 40, compared to the second MR control sequence 44.

In the exemplary scenario, in method step 100, the frequency deviation 40 relevant for the examination region can be determined. For this the frequency deviation 40 can for example specify the average value of the spatial distribution of the frequency deviation within the examination region. This average value, when the second reconstruction algorithm 42 is applied to the reference raw data 62, results in a global shift of the reference image data 63 in the direction of the phase encoding corresponding to the effective bandwidth. For example a frequency deviation 40 of 50 Hertz would cause a shift by 5 pixels. For such a shift the first modulation function 45 typically provides the application of a linear phase to the reference raw data 62, whereby modulated reference data 64 are created in method step 300. A reconstruction of the reference raw data 62 into reference image data 63 is not required.

Figure 5:
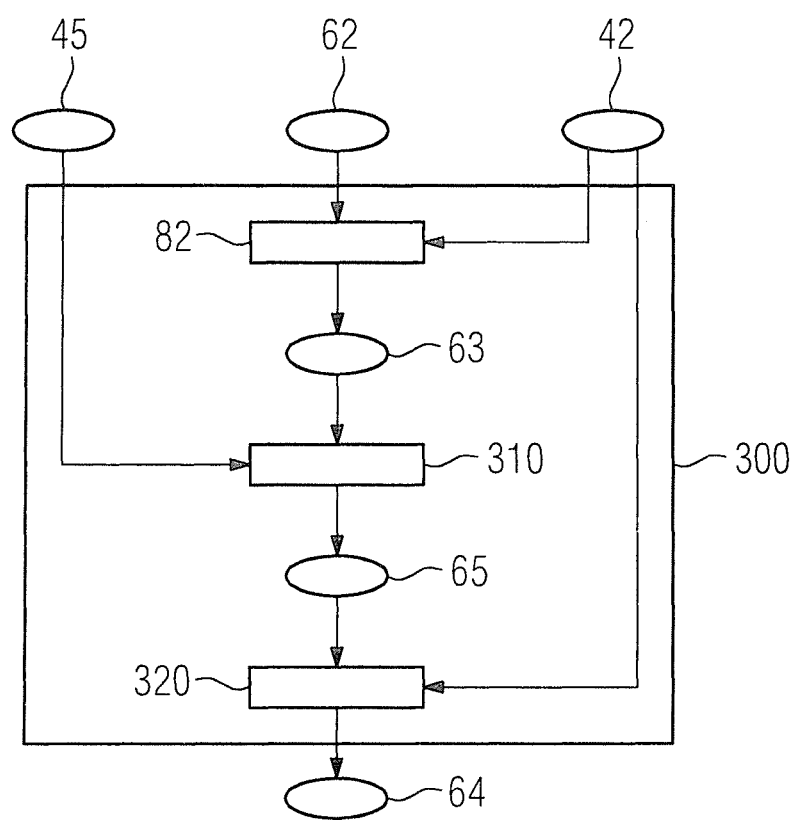
FIG. 5 is a more detailed flowchart of a method step of the third embodiment of the inventive method.

FIG. 5 shows a more detailed flowchart of a method step of the third embodiment of an inventive method. In this embodiment of the method step 300 of the third embodiment of the inventive method, the creation of the modulated reference data 64 on the basis of the first modulation function 45 and of the reference raw data 62 additionally taking into account the second reconstruction algorithm 42, is specified. Method step 300 includes the method steps 82, 310 and 320 here.

Initially, in method step 82, the reference image data 63 are reconstructed from the reference raw data 62 by means of the second reconstruction algorithm 42. Based on the first modulation function 45, modified reference data 65 are created in method step 310. This is followed, in method step 320, by a back transformation of the modified reference data 65 from the image space into k-space, by the inverse of the second reconstruction algorithm 42 creating the modulated reference data 64 from the modified reference data 65. This embodiment of the inventive method makes it possible for the algorithm for a k-space-based parallel MR imaging technique included in the combination algorithm to be able to be applied independently of a first modulation function 45 acting in the image space.

FIG. 6 is a flowchart of a fourth embodiment of the inventive method. The flowchart depicted shows a method for a reconstruction of image data 52 from undersampled raw data 51 and reference data 61, which largely corresponds to the first embodiment of the method shown in FIG. 2. It additionally has a method for determination of the frequency deviation 40 based on the undersampled raw data 51. In the embodiment shown, the reference data 61 are also used for determination of the frequency deviation 40. A repeated explanation of the elements occurring in the first embodiment of the method is not necessary.

The undersampled raw data 51 recorded in method step 80 by means of the first MR control sequence 43 are reconstructed together with the reference data 61 by the combination algorithm in accordance with method step 400. Distorted image data 53 is created by this. Based on the distorted image data 53 the frequency deviation 40 is established in method step 100. The frequency deviation 40 thus established is typically a first approximation of the real frequency deviation. Subsequently, in accordance with the embodiment of the method for reconstruction of the image data 52 on the basis of the established frequency deviation 40, the method steps 200, 300 and 400 are carried out.

For a more exact determination of the frequency deviation 40, the method step 100 can optionally be applied again to the image data 52, wherein the frequency deviation 40 resulting therefrom can be differentiated from that previously determined, in particular with large frequency deviations. In the further course of the method, in accordance with the embodiment of the method for reconstruction of the image data 52 on the basis of the established frequency deviation 40, the method steps 200, 300 and 400 are carried out. This process can be repeated iteratively.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for reconstructing image data of an object from undersampled raw data and reference data, said method comprising:

providing undersampled raw data to a computer, said undersampled raw data having been acquired from an examination region of an object by operating a magnetic resonance data acquisition scanner with a magnetic resonance control sequence, to which a reconstruction algorithm is assigned for reconstructing image data from the raw data;

also providing said computer with reference data;

in said computer, determining a disturbance variable in said examination region, said disturbance variable being a frequency deviation;

in said computer, establishing a modulation function that describes an influence of the disturbance variable on the magnetic resonance control sequence;

in said computer, generating modulated reference data from the modulation function and the reference data, such that said modulated reference data are subjected to the influence that the disturbance variable has on the raw data;

in said computer, executing a combination algorithm in order to reconstruct image data from said undersampled raw data using said modulated reference data; and making the image data available in electronic form from the computer as a data file.

2. A method as claimed in claim 1 wherein said magnetic resonance control sequence is a first magnetic resonance control sequence and said reconstruction algorithm is a first reconstruction algorithm, and wherein providing reference data to the computer comprises providing reference image data to the computer that were reconstructed from reference raw data acquired by operating said magnetic resonance data acquisition scanner with a second MR control sequence, with said reference image data being reconstructed from said reference raw data using a second reconstruction algorithm assigned to the second magnetic resonance control sequence, and executing said combination algorithm as a combination algorithm that comprises said first reconstruction algorithm and an algorithm for image-based parallel magnetic resonance imaging.

3. A method as claimed in claim 2 wherein said modulation function is a first modulation function, and comprising establishing, in said computer, a second modulation function that describes an influence of said disturbance variable on said second magnetic resonance control sequence, and generating said modulated reference data from said first modulation function and said second modulation function, so that an influence of the disturbance variable on the reference data is eliminated as a result of the second magnetic resonance control sequence.

4. A method as claimed in claim 2 wherein said first magnetic resonance control sequence has a higher sensitivity with respect to the disturbance variable than said second magnetic resonance control sequence.

5. A method as claimed in claim 2 wherein said first magnetic resonance control sequence is an echo planar imaging sequence.

6. A method as claimed in claim 2 wherein said second magnetic resonance control sequence is a gradient echo sequence.

7. A method as claimed in claim 2 wherein said first magnetic resonance control sequence is an echo planar imaging sequence and said second magnetic resonance control sequence is a gradient echo sequence.

8. A method as claimed in claim 1 wherein said magnetic resonance control sequence is a first magnetic resonance control sequence and said reconstruction algorithm is a first reconstruction algorithm, and wherein providing said reference data to said computer comprises providing reference raw data to said computer that were acquired by operating said magnetic resonance data acquisition scanner with a second magnetic resonance control sequence, to which a second reconstruction algorithm for reconstructing reference image data from the reference raw data is assigned, and comprising executing said combination algorithm as an algorithm for k-space-based parallel magnetic resonance imaging.

9. A method as claimed in claim 8 comprising reconstructing reference image data from said reference raw data using said second reconstruction algorithm, generating modified reference data using said modulation function, and generating said modulated reference data from said modified reference data by applying an inverse of said second reconstruction algorithm to said modified reference data.

10. A method as claimed in claim 8 wherein said modulation function is a first modulation function, and comprising establishing, in said computer, a second modulation function that describes an influence of said disturbance variable on said second magnetic resonance control sequence, and generating said modulated reference data from said first modulation function and said second modulation function, so that an influence of the disturbance variable on the reference data is eliminated as a result of the second magnetic resonance control sequence.

11. A method as claimed in claim 8 wherein said first magnetic resonance control sequence has a higher sensitivity with respect to the disturbance variable than said second magnetic resonance control sequence.

12. A method as claimed in claim 8 wherein said first magnetic resonance control sequence is an echo planar imaging sequence.

13. A method as claimed in claim 8 wherein said second magnetic resonance control sequence is a gradient echo sequence.

14. A method as claimed in claim 8 wherein said first magnetic resonance control sequence is an echo planar imaging sequence and said second magnetic resonance control sequence is a gradient echo sequence.

15. A method as claimed in claim 1 comprising determining said disturbance variable in said examination region with a spatial distribution in said examination region.

16. A method as claimed in claim 1 comprising establishing said disturbance variable before acquiring said raw data in an adjustment measurement of said magnetic resonance data acquisition scanner.

17. A method as claimed in claim 1 comprising establishing said disturbance variable from said raw data.

18. A method as claimed in claim 17 comprising determining said disturbance variable from distorted image data reconstructed from the undersampled raw data and said reference data by said combination algorithm.

19. A magnetic resonance apparatus comprising:
a magnetic resonance data acquisition scanner configured to acquire undersampled raw data from an examination region of an object by operating a magnetic resonance data acquisition scanner with a magnetic resonance control sequence, to which a reconstruction algorithm is assigned for reconstructing image data from the raw data;
a computer provided with said undersampled raw data;
said computer also being provided with reference data;
said computer being configured to determine a disturbance variable in said examination region, said disturbance variable being a frequency deviation;
said computer being configured to establish a modulation function that describes an influence of the disturbance variable on the magnetic resonance control sequence;
said computer being configured to generate modulated reference data from the modulation function and the reference data, such that said modulated reference data are subjected to the influence that the disturbance variable has on the raw data;

said computer being configured to execute a combination algorithm in order to reconstruct image data from said undersampled raw data using said modulated reference data; and said computer being configured to make the image data available in electronic form from the computer as a data file.

20. A non-transitory, computer-readable data storage medium encoded with programming instructions, said storage medium being loaded into a computer system of a magnetic resonance apparatus that comprises a magnetic resonance data acquisition scanner, said programming instructions causing said computer system to:

receive undersampled raw data having been acquired from an examination region of an object by operating the magnetic resonance data acquisition scanner with a magnetic resonance control sequence, to which a reconstruction algorithm is assigned for reconstructing image data from the raw data;

also receive or generate reference data;

determine a disturbance variable in said examination region, said disturbance variable being a frequency deviation;

establish a modulation function that describes an influence of the disturbance variable on the magnetic resonance control sequence;

generate modulated reference data from the modulation function and the reference data, such that said modulated reference data are subjected to the influence that the disturbance variable has on the raw data;

execute a combination algorithm in order to reconstruct image data from said undersampled raw data using said modulated reference data; and make the image data available in electronic form from the computer as a data file.

* * * * *